United States Patent
Ma et al.

(10) Patent No.: US 9,691,579 B2
(45) Date of Patent: Jun. 27, 2017

(54) PACKAGE MEMS SWITCH AND METHOD

(71) Applicant: Intel Corporation, Santa Clara, CA (US)

(72) Inventors: Qing Ma, San Jose, CA (US); Johanna Swan, Scottsdale, AZ (US); Valluri Rao, Saratoga, CA (US); Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/368,771

(22) PCT Filed: Dec. 17, 2013

(86) PCT No.: PCT/US2013/075764
§ 371 (c)(1),
(2) Date: Jun. 25, 2014

(87) PCT Pub. No.: WO2015/094184
PCT Pub. Date: Jun. 25, 2015

(65) Prior Publication Data
US 2016/0020051 A1    Jan. 21, 2016

(51) Int. Cl.
*H01H 59/00* (2006.01)
*H01Q 5/314* (2015.01)
*H01H 50/00* (2006.01)

(52) U.S. Cl.
CPC ...... *H01H 59/0009* (2013.01); *H01H 50/005* (2013.01); *H01Q 5/314* (2015.01); *H01H 2229/016* (2013.01); *H01H 2229/05* (2013.01); *H01L 2924/15311* (2013.01); *H01L 2924/16152* (2013.01)

(58) Field of Classification Search
CPC .............. H01H 53/06; H01H 59/0009; H01H 2229/05; H01H 2229/016; B81B 7/00
See application file for complete search history.

(56) References Cited

U.S. PATENT DOCUMENTS

| 6,373,007 | B1* | 4/2002 | Calcatera | ........... H01H 59/0009 200/181 |
| 6,570,750 | B1* | 5/2003 | Calcatera | ........... H01H 59/0009 361/113 |

(Continued)

FOREIGN PATENT DOCUMENTS

| TW | 201241908 A | 10/2012 |
| TW | 201534972 A | 9/2015 |
| WO | WO-2015094184 A1 | 6/2015 |

OTHER PUBLICATIONS

"International Application Serial No. PCT/US2013/075764, International Preliminary Report on Patentability mailed Jun. 30, 2016", 10 pgs.

(Continued)

*Primary Examiner* — Hoang Nguyen
(74) *Attorney, Agent, or Firm* — Schwegman Lundberg & Woessner, P.A.

(57) ABSTRACT

An electronic device and methods including a switch formed in a chip package are shown. An electronic device and methods including a switch formed in a polymer based dielectric are shown. Examples of switches shown include microelectromechanical system (MEMS) structures, such as cantilever switches and/or shunt switches.

12 Claims, 6 Drawing Sheets

(56) References Cited

U.S. PATENT DOCUMENTS

| | | | |
|---|---|---|---|
| 6,635,837 B2 | 10/2003 | Subramanian et al. | |
| 7,307,331 B2 | 12/2007 | Kipnis et al. | |
| 2002/0160549 A1* | 10/2002 | Subramanian | H01H 50/005 438/52 |
| 2003/0020173 A1* | 1/2003 | Huff | B81B 7/0064 257/774 |
| 2004/0124957 A1* | 7/2004 | Eliacin | B81C 1/00333 333/262 |
| 2005/0100269 A1 | 5/2005 | Ishizuya et al. | |
| 2005/0104694 A1 | 5/2005 | Cho et al. | |

OTHER PUBLICATIONS

"International Application Serial No. PCT/US2013/075764, International Search Report mailed Sep. 17, 2014", 3 pgs.
"International Application Serial No. PCT/US2013/075764, Written Opinion mailed Sep. 17, 2014", 8 pgs.
"Taiwan Application No. 103139778, Office Action Mailed Apr. 27, 2016", W/ English Translation, 12 pgs.
"Taiwan Application No. 103139778, Response filed Jul. 15, 2016 to Office Action Mailed Apr. 27, 2016", W/ English Claims, 18 pgs.

\* cited by examiner

PACKAGE MEMS SWITCH AND METHOD

This application is a U.S. National Stage Application under 35 U.S.C. 371 from International Application No. PCT/US2013/075764, filed Dec. 17, 2013, which is hereby incorporated by reference in its entirety.

TECHNICAL FIELD

Embodiments described herein generally relate to integrated circuit switches in microelectronic devices.

BACKGROUND

Microelectronic devices such as IC (integrated circuit) packages include large numbers of switches that are needed to perform a variety of operations. While transistors offer very small scale switching capabilities, in some applications a large loss in signal magnitude is included with each additional switch that is added in a signal pathway (insertion loss). Microelectromechanical system (MEMS) structures have been used to reduce insertion loss, however MEMS switches include a number of additional technical challenges. Improved MEMS switches are desired.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
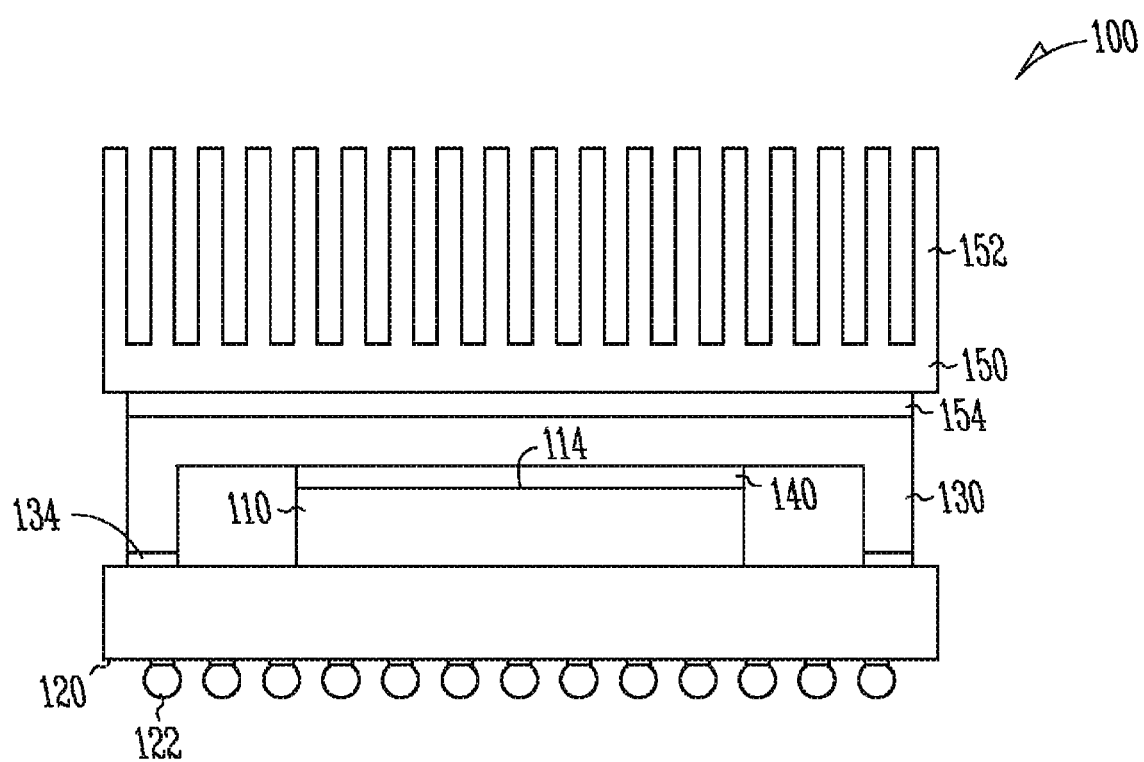
FIG. 1 is an example of an IC package in accordance with some embodiments of the invention.

FIG. 1 shows a cross-sectional representation of an IC package 100. In embodiments where the IC die is a processor die, the IC package can be termed a processor assembly. IC package 100 includes an IC die 110 mounted in "flip-chip" orientation with its active side facing downward to couple with an upper surface of a substrate 120. In one example, the substrate 120 is formed in situ on the die 110 in a bumpless build up layer (BBUL) process. In selected examples, the die 110 is encased at least partially within the substrate 120. In other examples, the die 110 is coupled to the substrate 120 through interconnections such as solder balls or bumps. The substrate 120 also shows a number of second level interconnections 122 on its opposite surface for mating with additional packaging structures such as boards (not shown).

In one example, the substrate 120 is formed in situ on the die by lithographically patterning a number of successive layers of dielectric material and conductors or traces. In one such example, an organic dielectric, such as a polymeric based material may be used. Polymeric materials include curable polymers that may be deposited and hardened with crosslink activation by methods such as chemical activation or UV light activation, etc. Polymeric based materials include composite materials having a polymer matrix and a dispersed phase.

Die 110 generates its heat from internal structure, including wiring traces, located near its active side; however, a significant portion of the heat is dissipated through its back side 114. Heat that is concentrated within the die is dissipated to a large surface that is in contact with the die in the form of an integrated heat spreader 130. A thermal interface material 140 is often provided between the die 110 and integrated heat spreader 130. In one embodiment, to further dissipate heat from the integrated heat spreader 130, a heat sink 150 optionally having fins 152 is coupled to the integrated heat spreader 130 via a second layer of thermal interface material. In another embodiment, the heat spreader is in the form of a metal plate that is attached (e.g. by welding) to a heat pipe for dissipating the heat generated by the die.

Figure 2A:
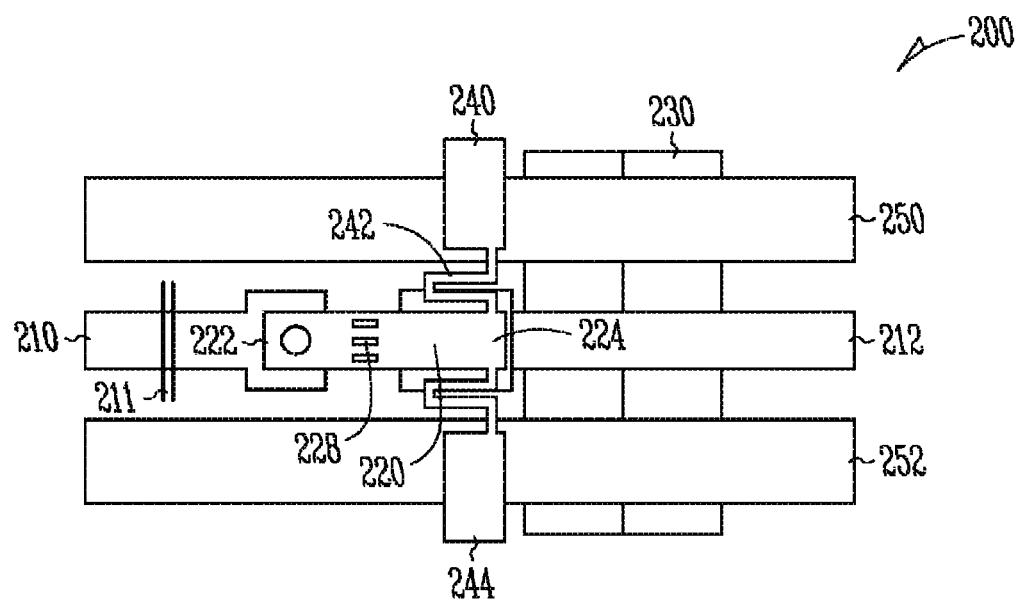
FIG. 2A is a top view of an example of an electronic device including a switch in accordance with some embodiments of the invention.

FIG. 2A shows an electronic device 200 according to one example. A conductive trace 210 is shown, with an adjacent trace section 212. A conductive beam 220 is configured to actuate a switch that either couples the conductive trace 210 to the adjacent trace section 212, or selectively isolates the conductive trace 210 from the adjacent trace section 212. The conductive beam 220 includes a first end 222 and a second end 224. In the example shown in FIG. 2A, the first end 222 is fixed to the package substrate to form a cantilever switch.

Figure 2B:
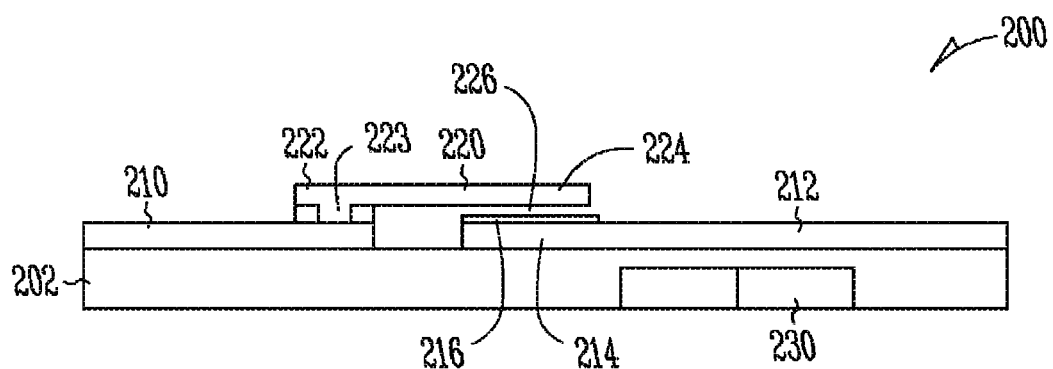
FIG. 2B is a side view of the electronic device from FIG. 2A in accordance with some embodiments of the invention.

FIG. 2B shows the first end 222 of the conductive beam 220 fixed to the conductive trace 210, and electrically coupled through a via 223. FIG. 2B further shows the second end 224 of the conductive beam 220 spaced apart from the adjacent trace section 212 by a gap 226. In one method of operation, the conductive beam 220 is selectively actuated by flexing as a cantilever, bringing the second end 224 of the conductive beam 220 closer to the adjacent trace section 212 at an end 214 of the adjacent trace section 212. In one example, one or more openings 228 are etched or otherwise formed at a location on the conductive beam 220 to tune a flexing force.

FIGS. 2A and 2B show a magnet 230, for example, a permanent magnet that is used as one part of a system for selectively actuating flexing of the conductive beam 220. FIG. 2A further shows a first connection 240 and second connection 244 for application of a current through the end 224 of the conductive beam 220 to create an electromagnetic flexing force on the conductive beam 220. The first connection 240 and second connection 244 are coupled to the conductive beam 220 through tethers 242. In the example shown in FIGS. 2A and 2B, the conductive beam 220 is selectively actuated, using force from both the magnet 230, and electrostatically by applying an electrostatic charge or DC voltage between the conductive beam 220 and trace 212.

In one example switching actuation, the conductive beam 220 is flexed using the electromagnetic force created by the magnet 230 and the applied current to deflect the second end 224 of the conductive beam 220 toward the end 214 of the adjacent trace section 212. In addition to the electromagnetic force provided by the magnet 230, the end 224 of the conductive beam 220 is pulled down and held in place by an electrostatic charge that is applied to the conductive beam 220 through the first connection 240, second connection 244, and tethers 242.

Because the second end 224 of the conductive beam 220 has been brought closer to the end 214 of the adjacent trace section 212 by the electromagnetic force, a smaller amount of charge is needed to maintain the second end 224 in a flexed position adjacent to the end 214 of the adjacent trace section 212. Additionally, in one example, the current for electromagnetic actuation need only be applied to bring the second end 224 of the conductive beam 220 closer to the end 214 of the adjacent trace section 212. After the electrostatic charge is applied to the conductive beam 220 to hold it in place, the current for electromagnetic actuation may be turned off to save power.

In one example, the electronic device 200 described is incorporated into a package portion of an IC package, such as the package 120 shown in FIG. 1. In one example, the package includes polymer dielectric material, and metallic traces to route signals from a semiconductor chip, through the package, and to a circuit board such as a mother board. In one example, fabrication of the electronic device 200 is easier and less expensive than fabrication in a semiconductor substrate, such as within the semiconductor chip itself.

In one example, the conductive beam 220 is formed from a portion of a metallic trace within the package. In one example, an amount of package dielectric is selectively removed from around the conductive beam 220, leaving the second end 224 suspended over the end 214 of the adjacent trace section 212. In one example, the electronic device 200 is formed during a bumpless build up layer (BBUL) package formation process. In an example BBUL process, layers of polymeric dielectric material are deposited in situ around a surface of a semiconductor chip. Through a number of successive steps, both the polymeric dielectric layers and a number of metallic conductor layers are lithographically patterned and etched to form routing traces and vias within the polymeric dielectric material.

Formation of the electronic device 200 as shown in FIGS. 2A and 2B can be easily accomplished using the lithographic processing techniques already being utilized in BBUL processing to form routing structures. Because the processing steps are already being utilized, there is minimal additional fabrication cost associated with formation of the electronic device 200 within the substrate. Organic dielectric portions 202 of the package are shown in FIG. 2B. Other portions of the organic package dielectric are not shown, in order to more clearly show the electronic device 200. One of ordinary skill in the art, having the benefit of the present disclosure, will recognize that examples of the electronic device 200 may be substantially embedded within an organic package dielectric, or other organic dielectric.

In some examples, it can be difficult to make features in BBUL processing as small as those available in semiconductor processing. For example, formation of small gaps such as gap 226 shown in FIG. 2B are difficult compared to formation of small gaps in semiconductor processing. With electrostatic actuation the electrostatic force for a given voltage is inversely proportional to the square of the gap and a small gap is required for operation at reasonable low voltages.

Using configurations of electronic devices shown in the present disclosure, such as electronic device 200, a larger gap 226 does not pose an operational challenge. As described above, even with a large gap 226, the electromagnetic force can be used to deflect the second end 224 of the conductive beam 220, even for a relatively large gap 226. After the second end 224 of the conductive beam 220 is pulled down by the electromagnetic force, the electrostatic charge provided by the first connection 240, second connection 244, and tethers 242 facilitate low power device operation. In one example, the gap 226 is greater than approximately 10 micrometers. In one example, the gap 226 is between approximately 10-15 micrometers.

In addition to forming devices in an organic package, such as BBUL, electronic devices, such as electronic device 200 can be formed in a number of useful organic based substrates including, but not limited to, flexible computing devices such as curved screen devices, flexible wearable devices such as wristbands, etc.

In one example, as shown in FIGS. 2A and 2B, the electronic device 200 includes a second layer of dielectric 216 over the end 214 of the adjacent trace section 212. In one example, the second dielectric 216 includes silicon nitride. In selected examples, the addition of the second dielectric 216 makes the switch a capacitive switch, where the proximity of the second end 224 of the conductive beam 220 to the end 214 of the adjacent trace section 212 is detected, in contrast to actual contact. Although a capacitive switch configuration is shown, the invention is not so limited.

In one example, an isolation capacitor 211 is included to isolate portions of the conductive beam 220 and to facilitate application of the electrostatic charge as discussed above. In one example, a first ground line 250 and a second ground line 252 are located on sides of the electronic device 200 to provide radio frequency impedance control for the conductive trace 210 and the adjacent trace section 212. Although ground lines 250, 252 are shown as one example in FIGS. 2A and 2B, the invention is not so limited.

Figure 3A:
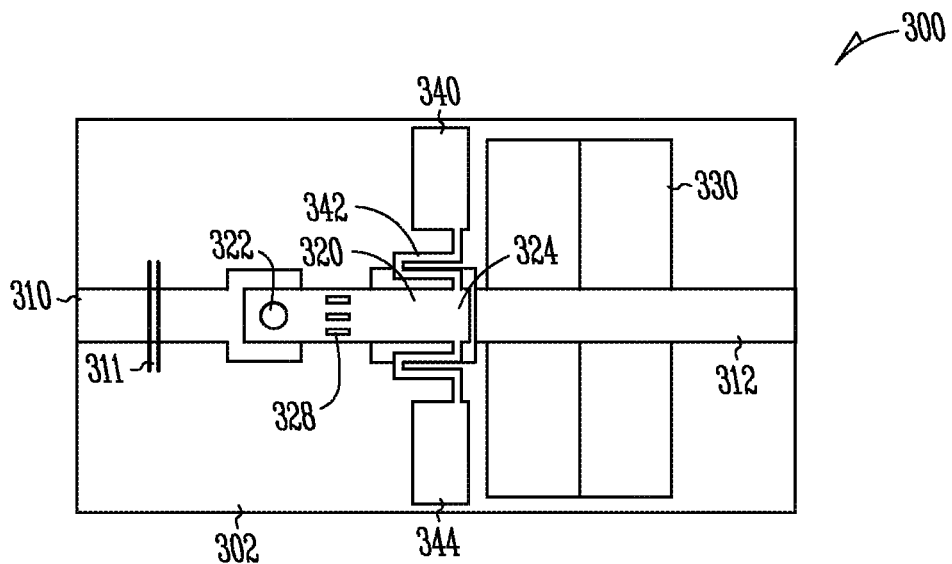
FIG. 3A is a top view of an example of an electronic device including another switch in accordance with some embodiments of the invention.
Figure 3B:
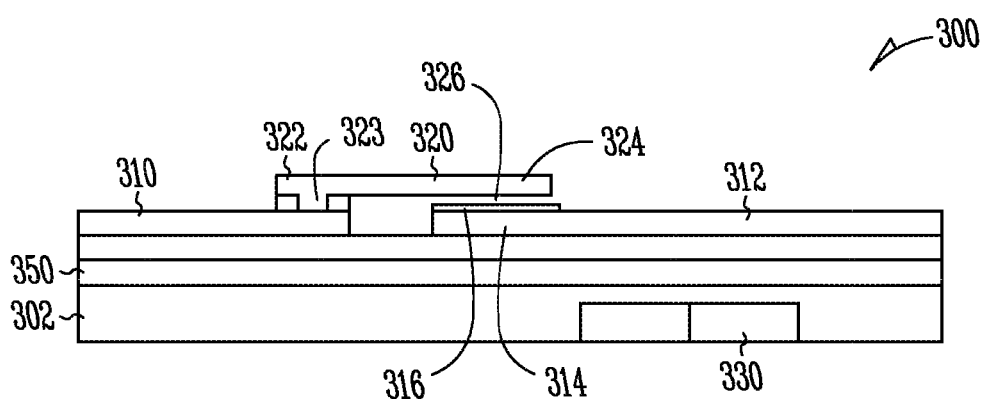
FIG. 3B is a side view of the electronic device from FIG. 3A in accordance with some embodiments of the invention.

FIGS. 3A and 3B show another electronic device 300 according to one example. A conductive trace 310 is shown, with an adjacent trace section 312. A conductive beam 320 is configured to actuate a switch that either couples the conductive trace 310 to the adjacent trace section 312, or selectively isolates the conductive trace 310 from the adjacent trace section 312. The conductive beam 320 includes a first end 322 and a second end 324. In the example shown in FIG. 3A, the first end 322 is fixed to the package substrate to form a cantilever switch.

FIG. 3B shows the first end 322 of the conductive beam 320 fixed to the conductive trace 310, and electrically coupled through a via 323. Additionally, organic dielectric portions 302 of the package are shown in FIG. 3B. FIG. 3B further shows the second end 324 of the conductive beam 320 spaced apart from the adjacent trace section 312 by a gap 326. As in the examples of FIGS. 2A and 28, in one method of operation, the conductive beam 320 is selectively actuated by flexing as a cantilever, bringing the second end 324 of the conductive beam 320 closer to the adjacent trace section 312 at an end 314 of the adjacent trace section 312. In one example, one or more openings 328 are etched or otherwise formed at a location on the conductive beam 320 to tune a flexing force.

Similar to the examples of FIGS. 2A and 2B, an electromagnetic force created by a magnet 330 such as a permanent magnet, and an applied current is used to provide a part of the actuation force. Also shown in FIG. 3A, a first connection 340 and second connection 344 for application of said current and also an electrostatic charge or DC voltage to the conductive beam 320. The first connection 340 and second connection 344 are coupled to the conductive beam 320 through tethers 342. In the example shown in FIGS. 3A and 3B, the conductive beam 320 is selectively actuated using both the magnetic and the electrostatic systems, including the permanent magnet 330, first connection 340, second connection 344, and tethers 342.

In one example, the electronic device 300 described is incorporated into a package portion of an IC package, such as the package 120 shown in FIG. 1. As in the example of electronic device 200 described above, forming the electronic device 300 within an organic dielectric such as a package can reduce manufacturing costs, and provide design flexibility such as enabling placement of electronic devices 200, 300 in unique products such as flexible electronics and/or wearable electronics.

In one example, an isolation capacitor 311 is included to isolate portions of the conductive beam 320 and to facilitate application of the electrostatic charge as discussed above. In one example, as shown in FIGS. 3A and 3B, the electronic device 300 includes a second layer of dielectric 316 over the end 314 of the adjacent trace section 312. In one example, the second dielectric 316 includes silicon nitride. Although a capacitive switch configuration is shown, the invention is not so limited.

The example of FIGS. 3A and 3B further shows a ground plane 350 located adjacent to and below components of the electronic device 300 to form a micro strip configuration. In one example, the ground plane 350 provides radio frequency impedance control for the conductive trace 310 and the adjacent trace section 312.

Figure 4:
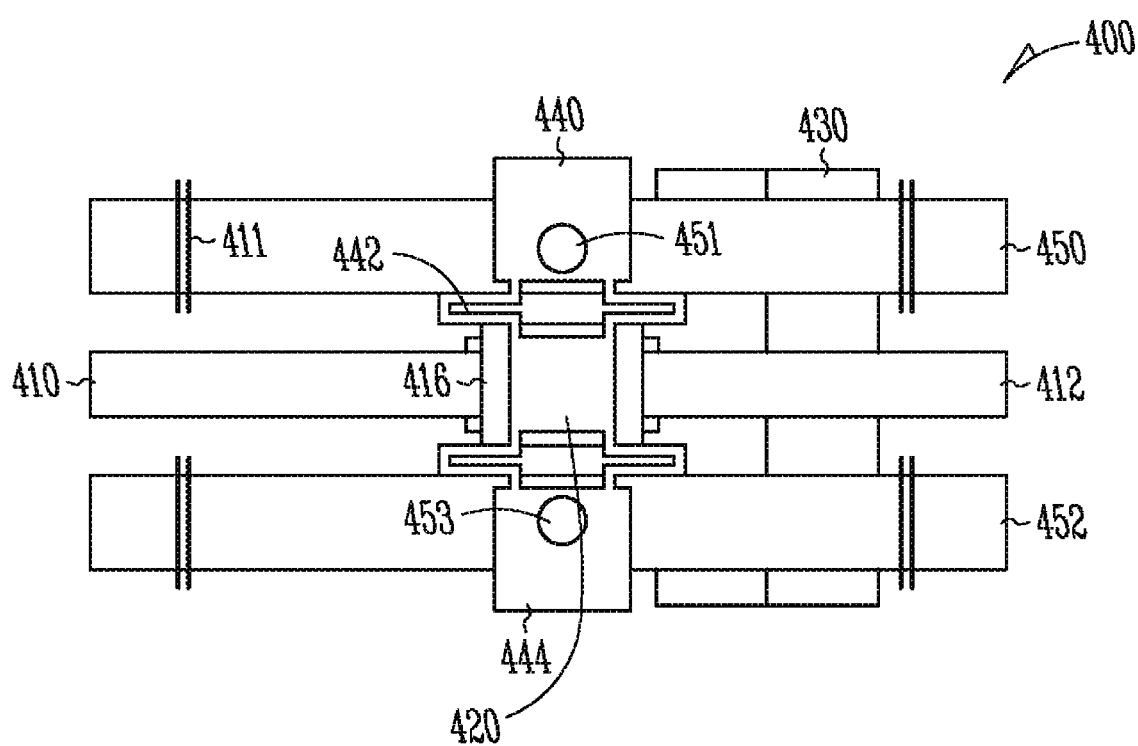
FIG. 4 is a top view of an example of an electronic device including another switch in accordance with some embodiments of the invention.

FIG. 4 shows another electronic device 400 according to one example. A continuous conductive trace 410-412 carrying an RF signal is shown. A conductive beam or plate 420 is configured to actuate a switch that either shorts or does not short the trace 410-412 to ground at RF frequencies, and is referred to as a shunt switch. In the example shown in FIG. 4, all of the conductive beam 420 moves up and down as provided by tethers 442 to form the shunt switch Similar to the examples of FIGS. 2A, 2B, 3A, and 3B, an electromagnetic force created by a permanent magnet 430 and an applied current is used to provide a part of the actuation force. Also shown in FIG. 4, a first connection 440 and second connection 444 for application of an electrostatic charge to the conductive beam 420. The first connection 440 and second connection 444 are coupled to the conductive beam 420 through tethers 442. In the example shown in FIG. 4, the conductive beam 420 is selectively actuated using both the electromagnetic and the electrostatic systems, including the permanent magnet 430, first connection 440, second connection 444, and tethers 442.

In one example, the electronic device 400 described is incorporated into a package portion of an IC package, such as the package 120 shown in FIG. 1. As in the example of electronic devices 200 and 300 described above, forming the electronic device 400 within an organic dielectric such as a package can reduce manufacturing costs, and provide design flexibility such as enabling placement of electronic devices 200, 300, 400 in unique products such as flexible electronics and/or wearable electronics.

FIG. 4 further shows adjacent ground lines 450 and 452. In one example, capacitors 411 ensure that a DC actuation voltage can be applied to that portion of the lines 450 and 452 between capacitors 411 without short circuiting to the ground lines 450 and 452. Although the capacitors 411 isolate the DC actuation voltage from the ground line 450, and 452, at RF frequencies they appear as a short circuit to the ground lines 450 and 452. The actuation lines which are the portion of 450 and 452 between the isolation capacitors are shown coupled to the first connection 440 and second connection 444 respectively through vias 451 and 453. In one example, as shown in FIG. 4, the electronic device 400 includes a second layer of dielectric 416 over the continuous conductive trace 410-412, that carries the RF signal. In one example, the second dielectric 416 includes silicon nitride. When the conductive beam 420 is actuated and contacts the silicon nitride, a very large capacitance results which effectively shorts the continuous RF line 410-412 to the conductive beam 420 at RF frequencies, to ground. Hence the RF signal on the continuous line 410-412 is short circuited to RF ground. This implementation is referred to a shunt switch which either shorts or does not short an RF signal to ground. In the series switches depicted in 200 and 300 however, the RF signal is interrupted or not interrupted. Combinations of series and shunt switch are used to provide greater isolation for the complete RF switch. Although a capacitive switch configuration is shown, the invention is not so limited.

The example of FIG. 4 may also include a ground plane located adjacent to and below components of the electronic device 400, similar to the example of FIGS. 3A, and 3B, to form a micro strip configuration. As described above, a ground plane provides RF impedance control for the continuous conductive trace 410 and 412.

Figure 5:
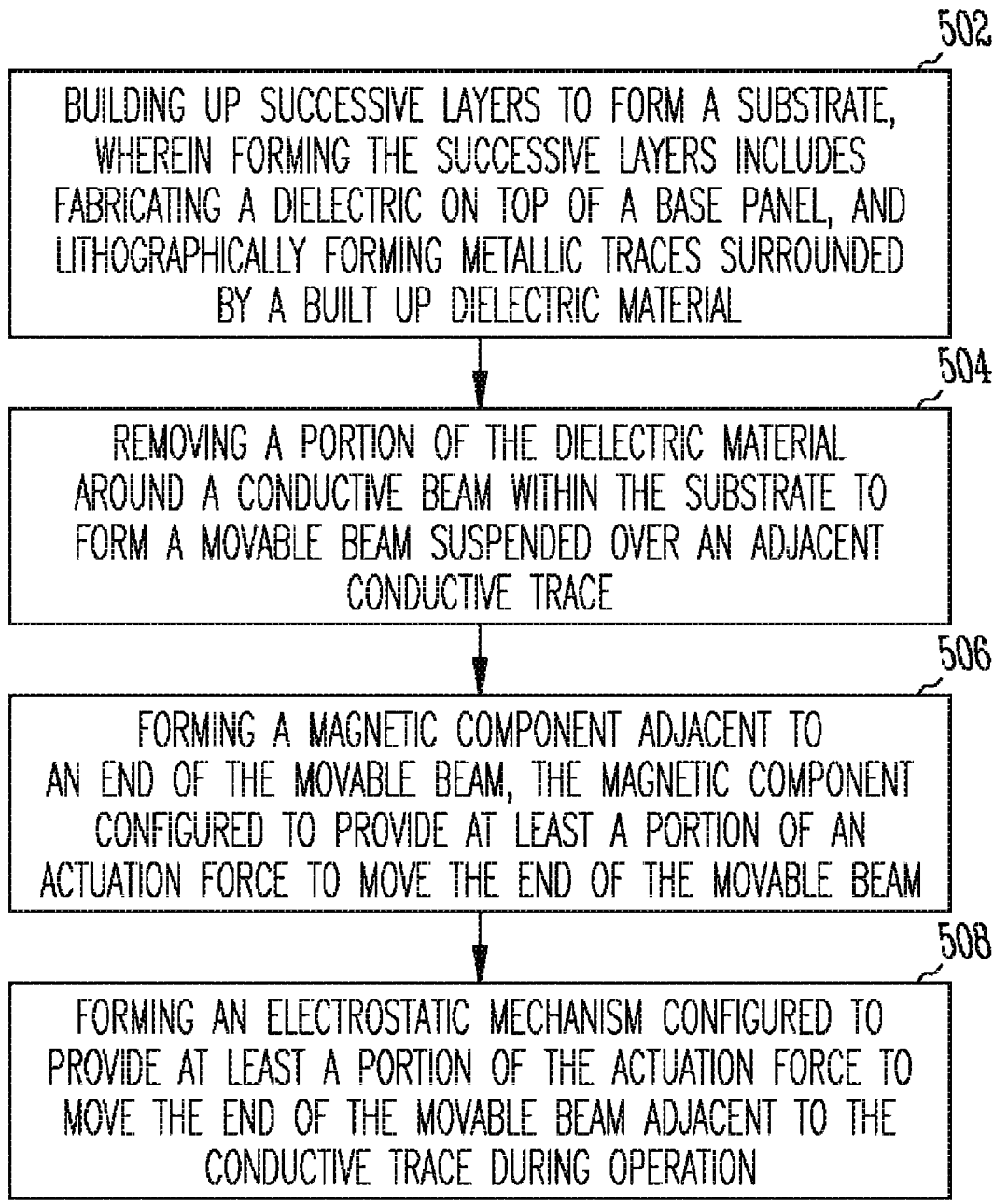
FIG. 5 is a flow diagram of a method in accordance with some embodiments of the invention.

FIG. 5 shows an example method of forming an electronic device according to an embodiment of the invention. In operation 502, successive layers are built up to form a substrate. In one example, forming the successive layers includes lithographically forming metallic traces surrounded by a built up dielectric material. In operation 504, a portion of the dielectric material is removed from around a conductive beam within the substrate to form a movable beam suspended over an adjacent conductive trace. Examples of material removal processes include, but are not limited to, chemical etching, physical/mechanical techniques, or plasma enhanced or reactive ion etching. Examples of movable beams include, but are not limited to, cantilever beams such as the examples shown in FIGS. 2A, 2B, 3A, and 3B, and shunt beams such as the example shown in FIG. 4.

In operation 506, a magnetic component is formed adjacent to an end of the movable beam. In operation 508, an electrostatic mechanism is formed that is configured to provide at least a portion of an actuation force to move the end of the movable beam adjacent to the conductive trace during operation. Examples of forming the magnetic component include, but are not limited to embedding a permanent magnet at a beginning of a process flow, or attaching a permanent magnet externally at an end of the process flow.

As discussed above, in one example the electronic device is formed in a package substrate, in contrast to within a semiconductor material such as a semiconductor die. In one example, the substrate includes an organic dielectric material such as a polymer based dielectric. In one example conductive traces, such as copper traces, are also formed within the substrate. In one example, as discussed above, the substrate and examples of electronic devices described above, are formed using a BBUL process.

Figure 6:
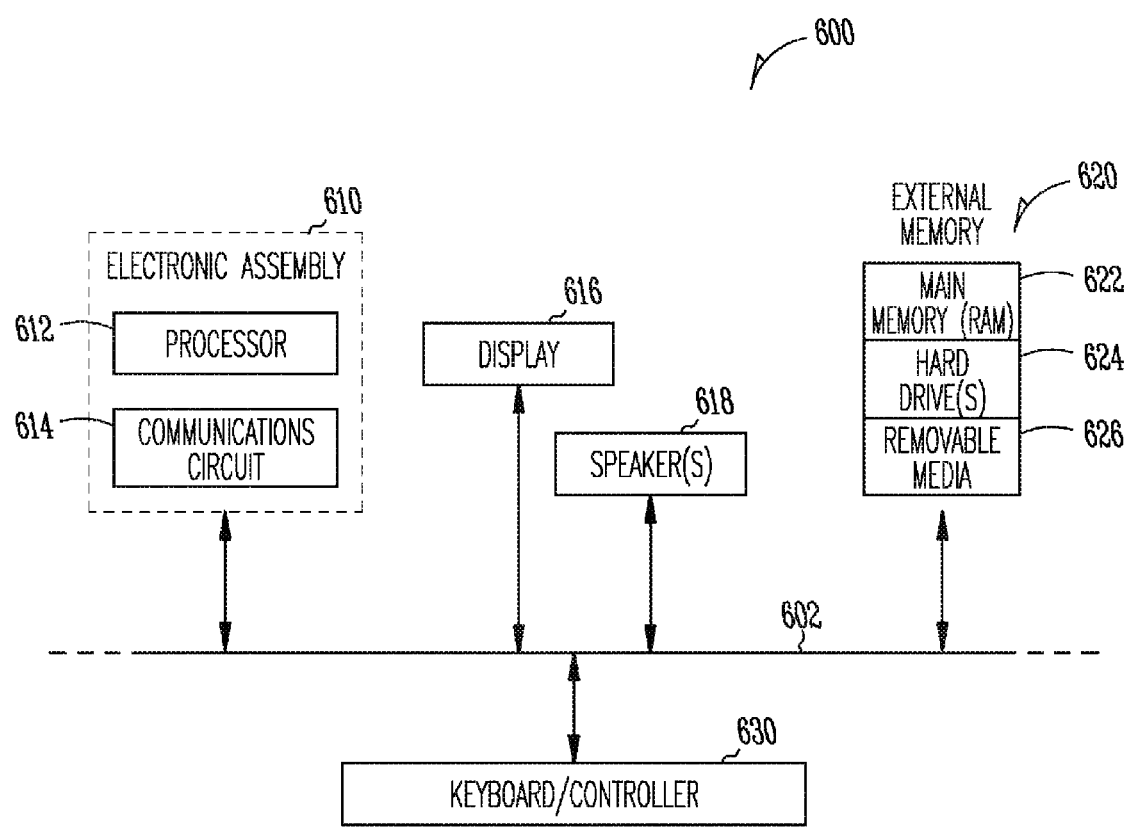
FIG. 6 is block diagram of an electronic system in accordance with some embodiments of the invention.

An example of an electronic device using electronic devices and switches as described in the present disclosure is included to show an example of a higher level device application for the present invention. FIG. 6 is a block diagram of an electronic device 600 incorporating at least one MEMS switch and/or method in accordance with at least one embodiment of the invention. Electronic device 600 is merely one example of an electronic system in which embodiments of the present invention can be used. Examples of electronic devices 600 include, but are not limited to personal computers, tablet computers, mobile telephones, game devices, MP3 or other digital music players, etc. In one example, at least one MEMS switch and/or method in accordance with at least one embodiment of the invention is used in conjunction with an antenna for selecting a desired frequency. MEMS switches are useful in antenna systems because they may provide switching capability with very low loss of signal, or insertion loss, from the switches.

In this example, electronic device 600 comprises a data processing system that includes a system bus 602 to couple the various components of the system. System bus 602 provides communications links among the various components of the electronic device 600 and can be implemented as a single bus, as a combination of busses, or in any other suitable manner.

An electronic assembly 610 is coupled to system bus 602. The electronic assembly 610 can include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 610 are a custom circuit, an application-specific integrated circuit (ASIC), or the like, such as, for example, one or more circuits (such as a communications circuit 614) for use in wireless devices like mobile telephones, tablet computers, laptop computers, two-way radios, and similar electronic systems. The IC can perform any other type of function.

The electronic device 600 can also include an external memory 620, which in turn can include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic device 600 can also include a display device 616, one or more speakers 618, and a keyboard and/or controller 630, which can include a mouse, trackball, touch screen, voice-recognition device, or any other device that permits a system user to input information into and receive information from the electronic device 600.

To better illustrate the method and apparatuses disclosed herein, a non-limiting list of embodiments is provided here:

Example 1 includes an electronic device. The electronic device includes a semiconductor chip coupled to a package substrate, and at least one switch housed at least partially within the package substrate, the switch including, a conductive trace, a conductive beam housed within a package substrate dielectric, the conductive beam having at least one end that is exposed within the dielectric and is free to move, wherein the at least one end is spaced apart from a corresponding conductive trace by a gap, a magnetic component configured to provide at least a portion of an actuation force to move the at least one end, and an electrostatic mechanism configured to provide at least a portion of the actuation force to move or hold in place the at least one end adjacent to the conductive trace.

Example 2 includes the electronic device of example 1, wherein the gap is between approximately 10-15 micrometers.

Example 3 includes the electronic device of any one of examples 1-2, wherein the package substrate dielectric includes an organic dielectric.

Example 4 includes the electronic device of any one of examples 1-3, further including a second dielectric between the conductive beam and the corresponding end of the conductive trace to form a capacitive switch.

Example 5 includes the electronic device of any one of examples 1-4, wherein the second dielectric includes silicon nitride.

Example 6 includes the electronic device of any one of examples 1-5, wherein the one end of the conductive beam is fixed to the package substrate to form a cantilever switch.

Example 7 includes the electronic device of any one of examples 1-6, wherein both ends of the conductive beam are free to move, forming a shunt switch.

Example 8 includes the electronic device of any one of examples 1-7, further including ground traces adjacent to the conductive trace on the same package level to form a co-planar waveguide.

Example 9 includes the electronic device of any one of examples 1-8, further including a ground plane beneath the conductive trace in the package to form a micro-strip waveguide.

Example 10 includes an electronic system. The electronic system includes a semiconductor chip coupled to a package substrate and at least one switch housed at least partially within the package substrate, the switch including, a conductive trace, a conductive beam housed within a package substrate dielectric, the conductive beam having at least one end that is exposed within the dielectric and is free to move, wherein the at least one end is spaced apart from a corresponding conductive trace by a gap, a magnetic component configured to provide at least a portion of an actuation force to move the at least one end, an electrostatic mechanism configured to provide at least a portion of the actuation force to move or hold in place the at least one end adjacent to the conductive trace, and an antenna coupled to the at least one switch, wherein the antenna is tunable to different frequencies by actuation of the at least one switch to vary the capacitive and/or inductive loading across the antenna.

Example 11 includes the electronic system of example 10, wherein the electronic device includes a mobile telephone.

Example 12 includes the electronic system of example 10, wherein the electronic device includes a tablet computer.

Example 13 includes a method that includes building up successive layers to form a substrate, wherein forming the successive layers includes fabricating a dielectric on top of a base panel, and lithographically forming metallic traces surrounded by a built up dielectric material, removing a portion of the dielectric material around a conductive beam within the substrate to form a movable beam suspended over an adjacent conductive trace, forming a magnetic component adjacent to an end of the movable beam, the magnetic component configured to provide at least a portion of an actuation force to move the end of the movable beam, and forming an electrostatic mechanism configured to provide at least a portion of the actuation force to move the end of the movable beam adjacent to the conductive trace during operation.

Example 14 includes the method of example 13, wherein removing a portion of the dielectric material around a conductive beam within the substrate to form a movable beam includes removing dielectric material around one end to form a flexible cantilever.

Example 15 includes the method of any one of examples 13-14, wherein removing a portion of the dielectric material around a conductive beam within the substrate to form a movable beam includes removing dielectric material completely from beneath the conductive beam to form a shunt switch.

Example 16 includes the method of any one of examples 13-15, wherein building up successive layers to form a substrate includes depositing polymer based layers.

Example 17 includes the method of any one of examples 13-16, wherein forming metallic traces includes forming metallic copper traces, and wherein removing a portion of the dielectric material around a conductive beam includes removing material around a copper beam and copper tethers.

Example 18 includes the method of any one of examples 13-17, wherein removing a portion of the dielectric material includes using chemical or physical/mechanical or plasma enhanced or reactive ion etching to remove a portion of the dielectric material.

Example 19 includes the method of any one of examples 13-18, further comprising coupling a semiconductor chip to the substrate.

Example 20 includes the method of any one of examples 13-19, wherein the substrate is formed in-situ on the semiconductor chip.

These and other examples and features of the present electronic device, and related methods will be set forth in part in the above detailed description. This overview is intended to provide non-limiting examples of the present subject matter—it is not intended to provide an exclusive or exhaustive explanation.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic device, comprising:
a semiconductor chip coupled to a package substrate;
at least one switch housed at least partially within the package substrate, the switch including;
a conductive trace;
a conductive beam housed within a package substrate dielectric, the conductive beam having at least one end that is exposed within the dielectric and is free to move;
wherein the at least one end is spaced apart from a corresponding conductive trace by a gap;
a magnetic component configured to provide at least a portion of an actuation force to move the at least one end;
an electrostatic mechanism configured to provide at least a portion of the actuation force to move or hold in place the at least one end adjacent to the conductive trace; and
the conductive beam includes one or more openings for tuning the actuation force required to move the at least one end of the conductive beam.

2. The electronic device of claim 1, wherein the gap is between approximately 10-15 micrometers.

3. The electronic device of claim 1, wherein the package substrate dielectric includes an organic dielectric.

4. The electronic device of claim 1, further including a second dielectric between the conductive beam and the conductive trace to form a capacitive switch.

5. The electronic device of claim 4, wherein the second dielectric includes silicon nitride.

6. The electronic device of claim 1, wherein the one end of the conductive beam is fixed to the package substrate to form a cantilever switch.

7. The electronic device of claim 1, wherein both ends of the conductive beam are free to move, forming a shunt switch.

8. The electronic device of claim 1, further including ground traces adjacent to the conductive trace on the same package level to form a co-planar waveguide.

9. The electronic device of claim 1, further including a ground plane beneath the conductive trace in the package to form a micro-strip waveguide.

10. An electronic system, comprising:
a semiconductor chip coupled to a package substrate;
at least one switch housed at least partially within the package substrate, the switch including;
a conductive trace;
a conductive beam housed within a package substrate dielectric, the conductive beam having at least one end that is exposed within the dielectric and is free to move;
wherein the at least one end is spaced apart from a corresponding conductive trace by a gap;
a magnetic component configured to provide at least a portion of an actuation force to move the at least one end; and
an electrostatic mechanism configured to provide at least a portion of the actuation force to move or hold in place the at least one end adjacent to the conductive trace;
the conductive beam includes one or more openings for tuning the actuation force required to move the at least one end of the conductive beam; and
an antenna coupled to the at least one switch, wherein the antenna is tunable to different frequencies by actuation of the at least one switch to vary the capacitive and/or inductive loading across the antenna.

11. The electronic system of claim 10, wherein the electronic device includes a mobile telephone.

12. The electronic system of claim 10, wherein the electronic device includes a tablet computer.

* * * * *